(12) United States Patent
Chang et al.

(10) Patent No.: US 10,923,666 B1
(45) Date of Patent: Feb. 16, 2021

(54) HOLE TRANSPORTING MATERIAL, MANUFACTURING METHOD THEREOF, AND ORGANIC PHOTODIODE THEREOF

(71) Applicant: RAYNERGY TEK INC., Hsinchu (TW)

(72) Inventors: Yi-Ming Chang, Hsinchu (TW); Nai-Wei Teng, Hsinchu (TW)

(73) Assignee: RAYNERGY TEK INC., Hsinchu (TW)

( * ) Notice: Subject to any disclaimer, the term of this patent is extended or adjusted under 35 U.S.C. 154(b) by 0 days.

(21) Appl. No.: 16/535,261

(22) Filed: Aug. 8, 2019

(51) Int. Cl.
*H01L 51/00* (2006.01)
*H01L 51/42* (2006.01)

(52) U.S. Cl.
CPC ...... *H01L 51/0074* (2013.01); *H01L 51/0021* (2013.01); *H01L 51/4293* (2013.01); *H01L 51/0038* (2013.01); *H01L 51/0067* (2013.01); *H01L 2251/303* (2013.01)

(58) Field of Classification Search
CPC ............. H01L 51/0074; H01L 51/0021; H01L 51/4293; H01L 51/0038; H01L 51/0067; H01L 2251/303; H01L 51/5056–5068; H01L 51/0032–0095; H01L 2251/552; H01L 51/50–56; B32B 2457/206
See application file for complete search history.

(56) References Cited

U.S. PATENT DOCUMENTS

| | | | | |
|---|---|---|---|---|
| 2008/0238299 | A1* | 10/2008 | Cho | H01L 51/5278 313/503 |
| 2009/0085479 | A1* | 4/2009 | Ushikubo | H01L 51/5036 313/506 |
| 2011/0240996 | A1* | 10/2011 | Lin | H05B 33/12 257/43 |
| 2017/0117496 | A1* | 4/2017 | Koh | H01L 51/5088 |
| 2019/0071320 | A1* | 3/2019 | Kim | B01J 35/0013 |
| 2020/0176618 | A1* | 6/2020 | Ahn | H01L 31/022425 |

* cited by examiner

*Primary Examiner* — Shahed Ahmed
(74) *Attorney, Agent, or Firm* — WPAT, PC

(57) ABSTRACT

A hole transporting material comprises a conductive polymer coil, and a plurality of transition metal oxide particles, which suspended and dispersed in the conductive polymer coil. Wherein the transition metal oxide particles are formed in the conductive polymer coil by a sol-gel reaction. The invention also disclosed a method of manufacturing a hole transporting material and an organic photodiode. The hole transporting material of the present invention can has a good match with an electron donor material of an active layer, so that the organic photodiode including the hole transporting material said above can have better power conversion efficiency.

9 Claims, 19 Drawing Sheets

HOLE TRANSPORTING MATERIAL, MANUFACTURING METHOD THEREOF, AND ORGANIC PHOTODIODE THEREOF

BACKGROUND OF THE INVENTION

Field of the Invention

The present invention relates to an organic photodiode, especially relates to the organic photovoltaic device, organic photodetector, and organic light emitting diode with a hole transporting material.

Description of the Prior Art

Existing semiconductor products, such as integrated circuits (ICs), transistors, light emitting diodes and solar cells, are mostly based on inorganic semiconductors, especially based on silicon. This is because the carrier mobility of the inorganic semiconductor is higher than that of the organic semiconductor. Since the inorganic semiconductor has been developed for a long time, the raw materials of the inorganic semiconductor have been exploited in large quantities. Thus, the raw materials of the inorganic semiconductor are becoming more and more expensive. In addition, since the inorganic semiconductor is made through a high temperature manufacture process, it is necessary to use a silicone substrate or a glass substrate, which can withstand high temperatures. Thus, it is impossible to use a plastic substrate, which cannot withstand high temperature, on the semiconductors so that the inorganic semiconductor is inflexible.

Although the carrier mobility of the organic semiconductor is lower than that of the inorganic semiconductor, the organic semiconductor has many advantages that inorganic semiconductors do not include, such as easy process, low process cost, low temperature process, photoelectric characteristics capable of being adjusted by molecular structure, and the final products being large-area components and flexible, etc. At present, organic semiconductors have been widely used in various fields, among which the most important ones include organic light-emitting diodes (OLED), organic thin film transistors (OTFT), organic photodetector, and organic photovoltaic device (OPV).

There are two types, n-i-p type architecture (inverted) and p-i-n type architecture (conventional), of the organic photodiode. The n-i-p type architecture is the structure of substrate/cathode/electron transport layer (ETL)/active layer/hole transport layer (HTL)/anode, and p-i-n type is the structure of substrate/anode/HTL/active layer/ETL/cathode. The inverted architecture has attracted more and more attention due to simple preparation process and excellent stability With the development of the organic photodiode, poly(3, 4-ethylenedioxythiophene)polystyrene sulfonate (PEDOT: PSS), which is commonly used as the hole transporting material, cannot be well matched with the active layer. Thus, the power conversion efficiency (PCE) of the organic photodiode with PEDOT:PSS is difficult to improve. In addition, a solution-processable hole transport layer is very important for the inverted architecture. Therefore, providing an appropriate and solution-processable hole transport layer material is an issue that needs to be actively solved.

SUMMARY OF THE INVENTION

In response to the above-mentioned problems, an objective of the present invention is providing a hole transporting material comprises a conductive polymer coil, and a plurality of transition metal oxide particles which are suspended and dispersed in the conductive polymer coil. Wherein, the transition metal oxide particles are formed in the conductive polymer coil by a sol-gel reaction.

In one embodiment, work function of the hole transporting material is deeper than the work function of PEDOT: PSS.

In one embodiment, the concentration of the plurality of transition metal oxide particles in the conductive polymer coil is in the range of 0.1 µL/mL~10 µL/mL.

In one embodiment, the concentration of the plurality of transition metal oxide particles in the conductive polymer coil is in the range of 0.5 µL/mL~5 µL/mL.

In one embodiment, the plurality of transition metal oxide particles comprise at least one of $MoO_3$, $V_2O_5$, NiO, and $WO_3$.

In one embodiment, the conductive polymer coil comprises at least one of polyacetylene, polyphenylene vinylene, polypyrrole, polythiophene, polyphenylene sulfide and their derivative.

In one embodiment, the conductive polymer coil comprises poly(3,4-ethylenedioxythiophene)polystyrene sulfonate (PEDOT:PSS).

Another objective of the present invention is providing a method of manufacturing a hole transporting material. The method comprises the steps as following: providing a precursor solution of a transition metal oxide; providing a conductive polymer solution; adding the precursor solution of the transition metal oxide into the conductive polymer; and stirring the mixture of the precursor solution of the transition metal oxide and the conductive polymer solution to cause a sol-gel reaction, and form a hole transporting material which comprising a conductive polymer and a plurality of sol-gel derived transition metal oxide particles.

In one embodiment, in the method of manufacturing the hole transporting material, work function of the hole transporting material is deeper than the work function of PEDOT: PSS.

In one embodiment, in the method of manufacturing the hole transporting material, the concentration of the plurality of transition metal oxide particles in the conductive polymer coil is in the range of 0.1 µL/mL~10 µL/mL.

In one embodiment, in the method of manufacturing the hole transporting material, the concentration of the plurality of transition metal oxide particles in the conductive polymer coil is in the range of 0.5 µL/mL~5 µL/mL.

In one embodiment, in the method of manufacturing the hole transporting material, the precursor solution of the transition metal oxide comprises a precursor of the transition metal oxide and an alcohol solvent, wherein the precursor of the transition metal oxide dissolved evenly in the alcohol solvent.

In one embodiment, in the method of manufacturing the hole transporting material, the precursor of the transition metal oxide includes at least one of vanadium (V) oxytriisopropoxide, vanadium(V) oxytriethoxide, tris(triphenylsiloxy)vanadium oxide, vanadium(V) oxychloride, ammonium molybdate, molybdenum(III) chloride, molybdenum (V) chloride, molybdenum(V) chloride, molybdenum(VI) tetrachloride oxide, tungsten oxychloride, and tungsten(VI) chloride.

In one embodiment, in the method of manufacturing the hole transporting material, the conductive polymer solution and the conductive polymer coil comprise at least one of polyacetylene, polyphenylene vinylene, polypyrrole, polythiophene, polyphenylene sulfide and their derivative.

In one embodiment, in the method of manufacturing the hole transporting material, the conductive polymer solution and the conductive polymer coil comprise poly(3,4-ethylenedioxythiophene)polystyrene sulfonate (PEDOT:PSS).

In one embodiment, in the method of manufacturing the hole transporting material, the plurality of transition metal oxide particles comprise at least one of $MoO_3$, $V_2O_5$, NiO, and $WO_3$.

Another objective of the present invention is providing an organic photodiode comprises an electrode pair, an active layer, an electron transport layer, and a hole transport layer. The electrode pair includes a cathode and an anode. The active layer is arranged between the cathode and the anode. The hole transport layer includes a hole transporting material which comprising a conductive polymer coil and a plurality of transition metal oxide particles, and the hole transport layer arranged between the anode and the active layer.

In one embodiment, the active layer includes an electron donor material, and a gap between the work function of the hole transporting material and HOMO level of the electron donor material is less than that between the work function of PEDOT:PSS and HOMO level of the electron donor material.

In other embodiment, the hole transport layer is formed by the hole transporting material with wet film formation.

In other embodiment, the organic photodiode includes one of the photovoltaic, photodetector, light-emitting diode, and transistor.

Compared with the prior art, the hole transporting material of the present invention can has a good match with an electron donor material of an active layer, so that the organic photodiode including the hole transporting material said above can have better power conversion efficiency than using PEDOT:PSS for a hole transporting material.

BRIEF DESCRIPTION OF THE APPENDED DRAWINGS

Some of the embodiments will be described in detail, with reference to the following figures, wherein like designations denote like members, wherein.

The advantages, spirits, and features of the present invention will be explained and discussed with embodiments and figures as follows.

DETAILED DESCRIPTION OF THE INVENTION

In order to make the advantages of the present invent, the spirit and features can be more easily and clearly understood, the detailed description and discussion will be followed by specific embodiments and with reference to the accompanying figures. It is noted that the specific embodiments are merely representative of the specific embodiments of the present invention, and the specific methods, devices, conditions, materials, and the like are not intended to limit the invention or the corresponding embodiments. Moreover, the devices in the figures are only used to express their relative positions and are not drawn in their actual proportions.

Figure 1:
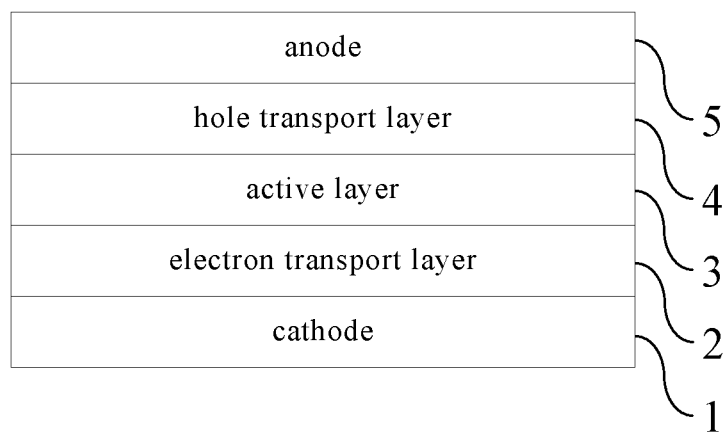
FIG. 1 is a structure diagram illustrating the organic photodiode according to an embodiment of the present invention.

Please refer to FIG. 1. FIG. 1 is a structure diagram illustrating the organic photodiode according to an embodiment of the present invention. As shown in FIG. 1, an organic photodiode of the present invention comprises an electrode pair, an active layer 3, an electron transport layer 2, and a hole transport layer 4. The electrode pair includes a cathode 1 and an anode 2. The active layer 3 is arranged between the cathode 1 and the anode 2. The electron transport layer 2 is arranged between the cathode 1 and the active layer 3, and the hole transport layer 4 is arranged between the anode 5 and the active layer 3. The hole transport layer 3 includes a hole transporting material which comprising a conductive polymer coil and a plurality of transition metal oxide particles.

Figure 2:
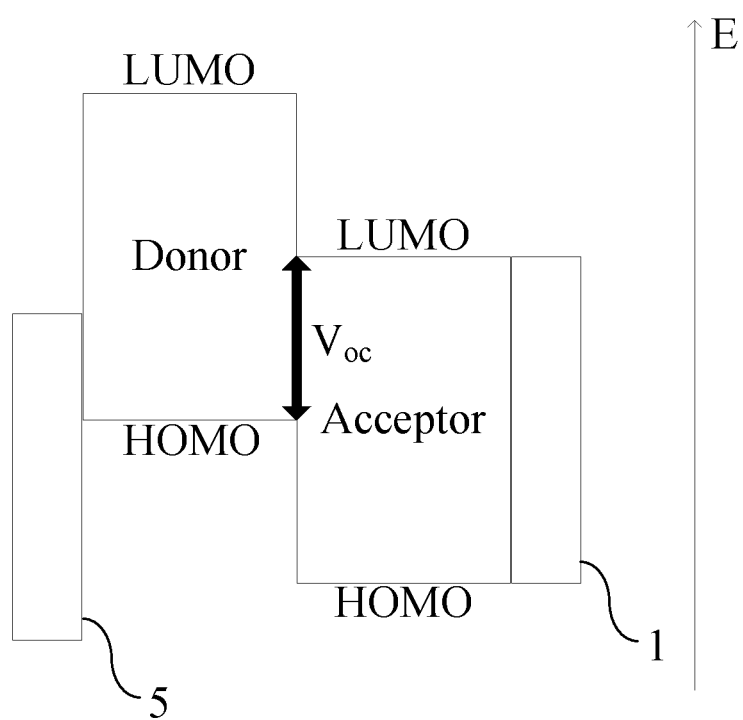
FIG. 2 is an energy level diagram of the organic photodiode of FIG. 1.
Figure 3:
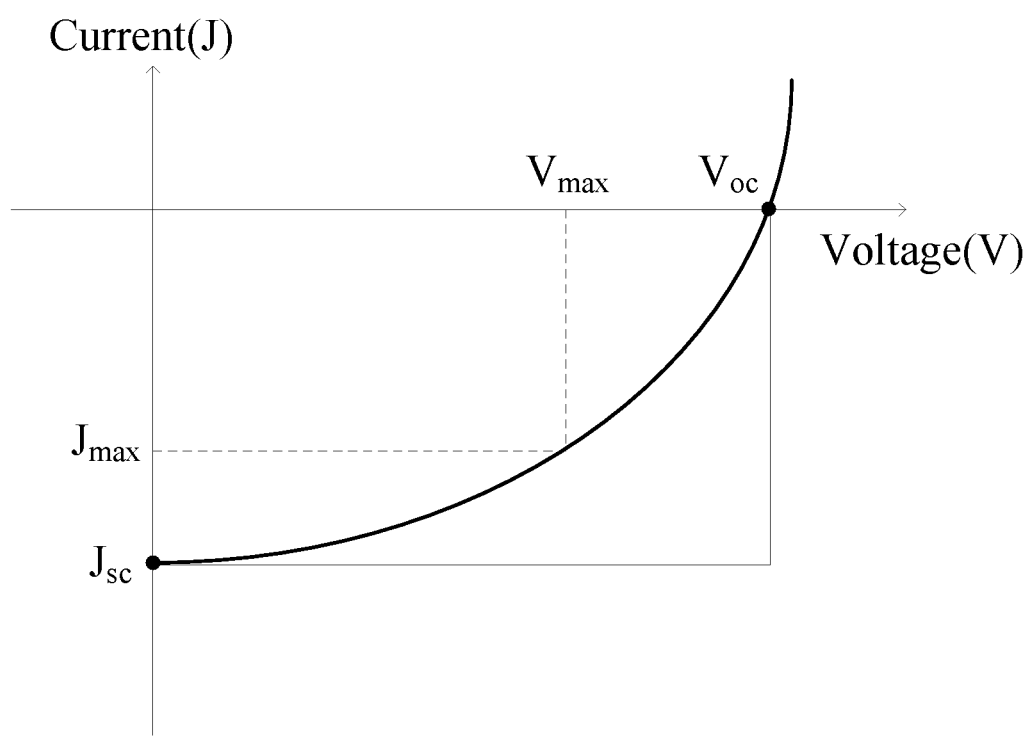
FIG. 3 is a schematic diagram of current versus voltage of the organic photodiode of FIG. 1.

For the convenience of understanding, the relevant proper nouns are explained first before explaining the technology of the present invention. Please refer to FIG. 2 and FIG. 3. FIG. 2 is an energy level diagram of the organic photodiode of FIG. 1. FIG. 3 is a schematic diagram of current versus voltage of the organic photodiode of FIG. 1. As shown in FIG. 2, in the process of converting solar energy into electrical energy, the sunlight is absorbed by the material of the active layer at first. After the electrons of the highest occupied molecular orbital (HOMO) absorb energy, they are excited to the lowest unoccupied molecular orbital (LUMO), and thus a plurality of bound electron-hole pairs are created, also known as excitons. When the excitons diffuse into the interface between the electron donor and the acceptor, the excitons separate and form free carriers after overcoming the binding energy. Finally, the electron holes are collected by the cathode and anode of the organic photodiode respectively, thereby converting the light energy into electrical energy.

The organic photodiode are typically tested at an air mass (AM) of 1.5 G. AM1.5 G is used to simulate the use of the organic photodiode when sunlight illuminates the organic photodiode at an incident angle of 48 degrees. Under this condition, the incident power per unit area of incident light is 100 mW/m$^2$. The effectiveness of the organic photodiode is primarily determined by their energy conversion efficiency (PCE) and can be calculated by the following formula: PCE=(FF×J$_{sc}$×V$_{oc}$)/P$_{in}$. Among them, PCE is energy conversion efficiency, FF is fill factor, J$_{sc}$ is short-circuit current, V$_{oc}$ is the open circuit voltage, and P$_{in}$ is the power density of the incident light source. As shown in FIG. 3, the short-circuit current (J$_{sc}$) refers to a current (photocurrent) generated by an accumulated photodiode under irradiation of incident light when the solar cell is short-circuited. The open circuit voltage (V$_{oc}$) is the voltage value when the current of the illumination device is equal to zero. The value of the open circuit voltage can be obtained from the difference between the HOMO level of the electron donor and the LUMO level of the electron acceptor (as shown in FIG. 2). The value of the fill factor (FF) can be obtained from the ratio of the two areas (power) in FIG. 3, and the formula is as follows: FF=(J$_{max}$×V$_{max}$)/(J$_{sc}$×V$_{oc}$).

At present, PEDOT:PSS is commonly used as the hole transport layer (HTL) material in the organic photodiode. However, due to the energy level mismatching between PEDOT:PSS and the electron donor material of the active layer, the power conversion efficiency (PCE) of the organic photodiode prepared by PEDOT:PSS is far less than that of MoO$_3$. MoO$_3$ is also commonly used as a material for HTL, and the organic photodiode prepared by MoO$_3$ has great power conversion efficiency. However, MoO$_3$ requires the preparation of the organic photodiode by a thermal evaporation process, which is prone to cause the problems of uneven HTL and difficulty in controlling thickness. In addition, MoO$_3$ is a photosensitive substance which is liable to cause photoclearization and cause structural cracking. Therefore, the organic photodiode produced by MoO$_3$ has poor light stability.

The reason for the lower power conversion efficiency of PEDOT:PSS should be related to the energy level matching of the electron donor. Since the PEDOT:PSS has a more serious energy level matching than MoO$_3$, the open circuit voltage will be smaller. The value of the open circuit voltage as described above can be obtained from the difference between the HOMO level of the electron donor and the LUMO level of the electron acceptor, so reducing the HOMO of donor will effectively increase the open circuit voltage.

In this regard, the present invention provides a hole transporting material having a good energy level matching with the electron donor. The hole transporting material comprises a conductive polymer coil, and a plurality of transition metal oxide particles, which is suspended and dispersed in the conductive polymer coil. Wherein, the transition metal oxide particles are formed in the conductive polymer coil by a sol-gel reaction.

Figure 4:
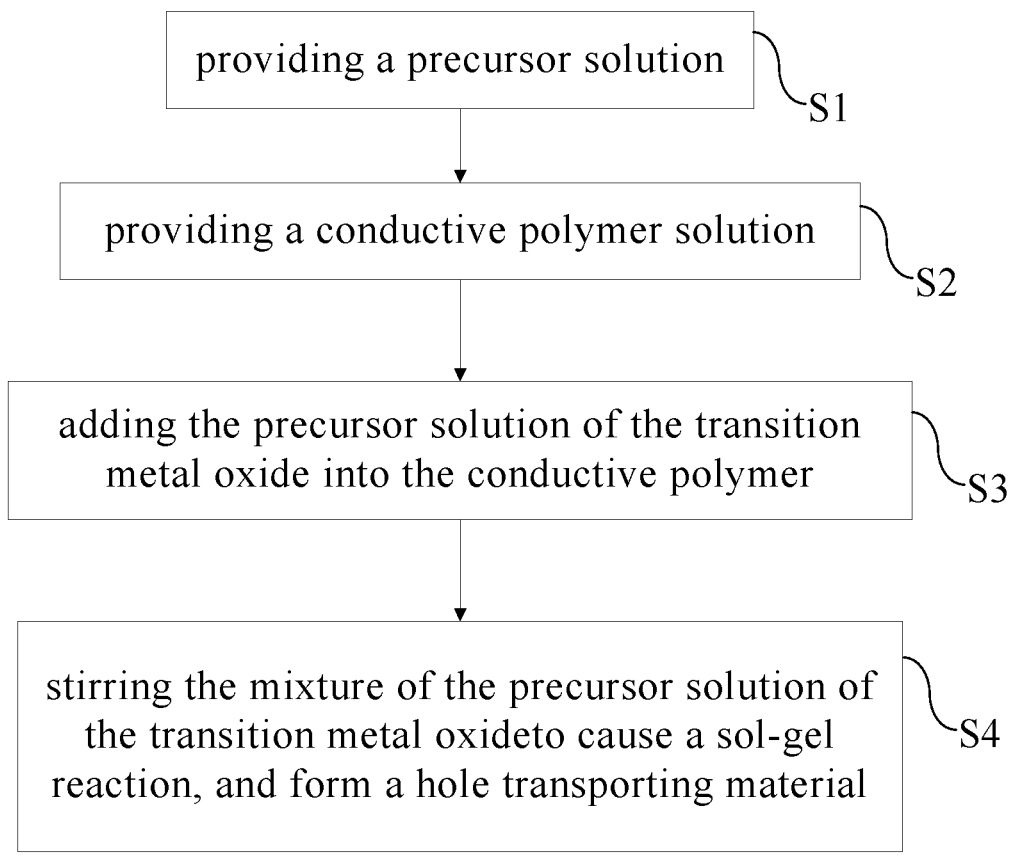
FIG. 4 is a step flow chart of the method of manufacturing a hole transporting material according to an embodiment of the present invention.

In addition, the present invention also provides a method of manufacturing a hole transporting material. Please refer to FIG. 4. FIG. 4 is a step flow chart of the method of manufacturing the hole transporting material according to an embodiment of the present invention. The method comprises the steps as following: step S1: providing a precursor solution of a transition metal oxide; step S2: providing a conductive polymer solution; Step S3: adding the precursor solution of the transition metal oxide into the conductive polymer; and step S4: stirring the mixture of the precursor solution of the transition metal oxide and the conductive polymer solution to cause a sol-gel reaction, and form a hole transporting material which comprises a conductive polymer coil and a plurality of transition metal oxide particles.

In this embodiment, In step S1, the precursor solution of the transition metal oxide comprises a precursor of the transition metal oxide and an alcohol solvent, wherein the precursor of the transition metal oxide dispersed evenly in the alcohol solvent. The precursor of the transition metal oxide includes at least one of vanadium (V) oxytriisopropoxide, vanadium(V) oxytriethoxide, tris(triphenylsiloxy)vanadium oxide, vanadium(V) oxychloride, ammonium molybdate, molybdenum(III) chloride, molybdenum(V) chloride, molybdenum(V) chloride, molybdenum(VI) tetrachloride oxide, tungsten oxychloride, and tungsten(VI) chloride. In step S4, the plurality of transition metal oxide particles comprise at least one of MoO$_3$, V$_2$O$_5$, NiO, and WO$_3$.

In step S4, the conductive polymer solution comprises at least one of polyacetylene, polyphenylene vinylene, polypyrrole, polythiophene, polyphenylene sulfide and their derivative. In this embodiment, the conductive polymer solution comprises poly(3,4-ethylenedioxythiophene)polystyrene sulfonate (PEDOT:PSS).

Next, the hole transporting material produced by the following synthesis method is explained: proving vanadium (V) oxytriisopropoxide as the precursor solution of the transition metal oxide; providing PEDOT:PSS as the conductive polymer solution; adding 2 mL of vanadium (V) oxytriisopropoxide solution (8.33 µL/mL precursor dissolved in 2-propanol) into 8 mL PEDOT:PSS; stirring the mixture of vanadium (V) oxytriisopropoxide and PEDOT:PSS to a react sol-gel reaction. In the sol-gel reaction, the mixture of vanadium (V) oxytriisopropoxide and PEDOT:PSS reacts hydrolysis reaction and condensation reaction to become to the hole transporting material (short for VOx:PEDOT:PSS) which comprising PEDOT:PSS as the conductive polymer coil and VOx as the plurality of transition metal oxide particles. Subsequently, the organic photodiode (ITO/ETL/active layer/VOx:PEDOT:PSS/Ag) is prepared with the hole transporting material through wet film formation.

Figure 5:
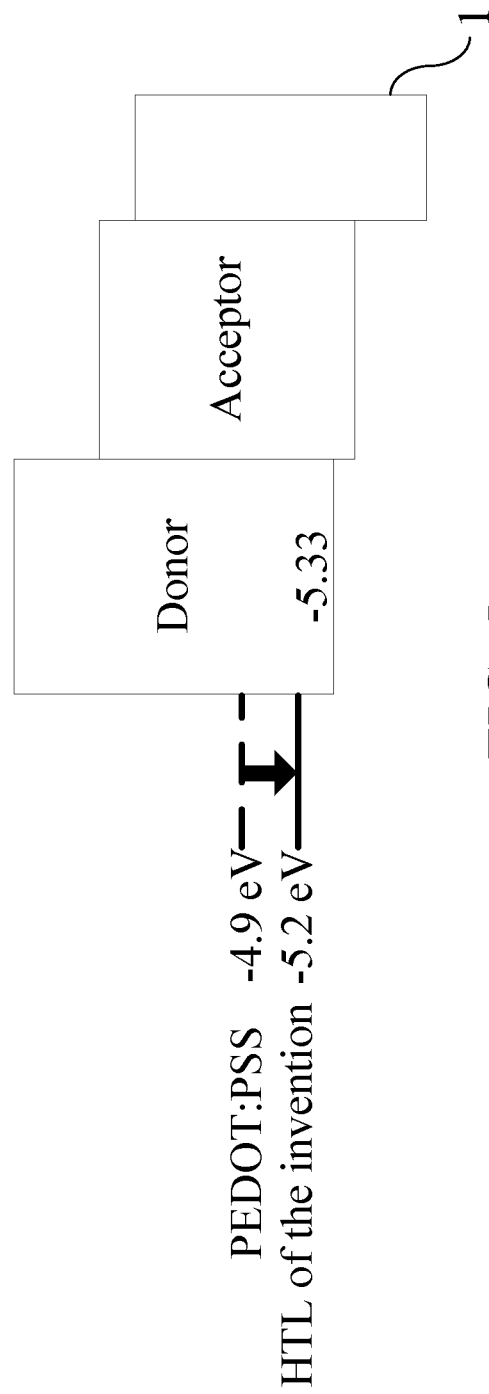
FIG. 5 is an energy level diagram of the organic photodiode with VOx:PEDOT:PSS according to an embodiment of the present invention.
Figure 6:
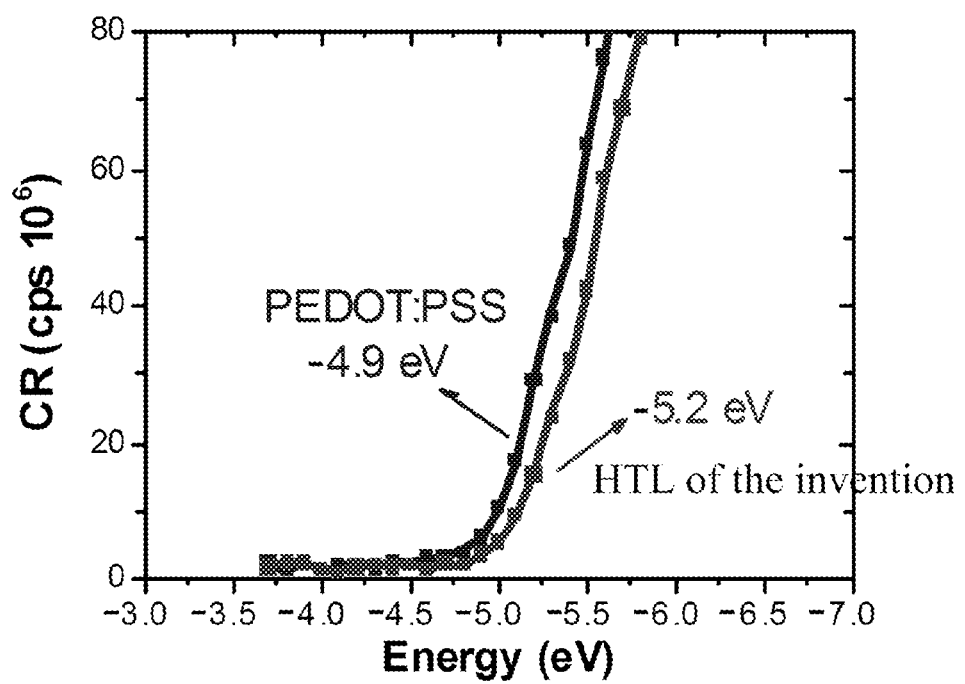
FIG. 6 is a schematic diagram of counting rate (CR) versus energy of the hole transporting material as VOx:PEDOT:PSS according to an embodiment of the present invention.
Figure 7:
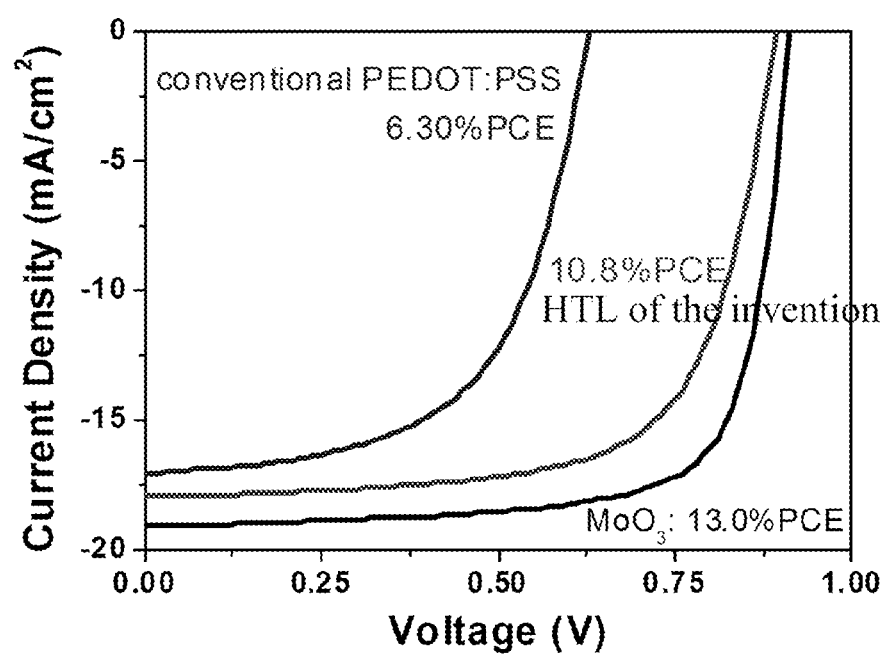
FIG. 7 is a schematic diagram of current versus voltage of the organic photodiode with VOx:PEDOT:PSS according to an embodiment of the present invention.
Figure 8A:
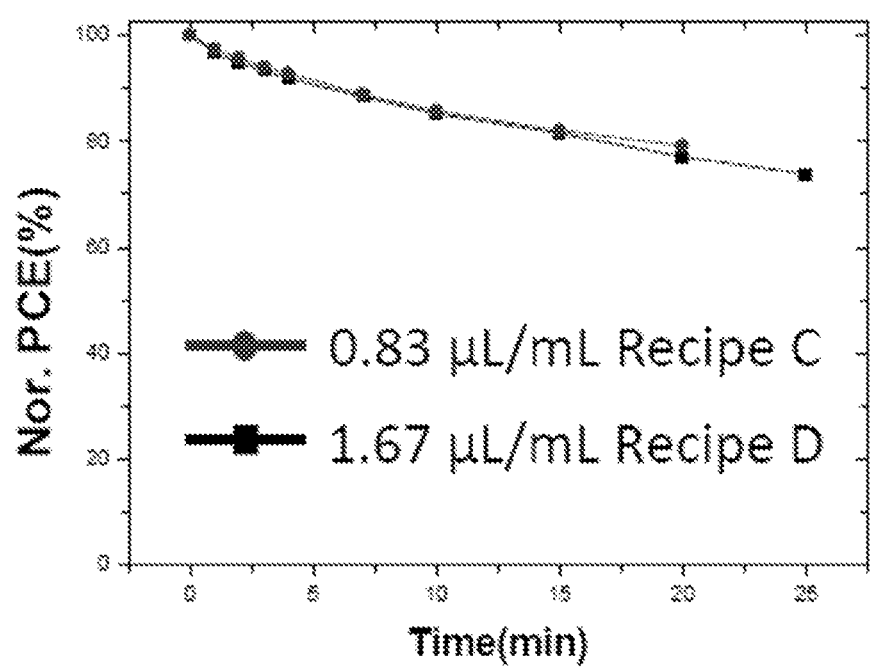
FIG. 8a to FIG. 8d are schematic diagrams of relating open-circuit voltage (FIG. 8a), short circuit current (FIG. 8b), fill factor (FIG. 8c), and power conversion efficiency (FIG. 8d) versus time of the organic photodiode with VOx:PEDOT:PSS for different recipe according to an embodiment of the present invention.
Figure 8B:
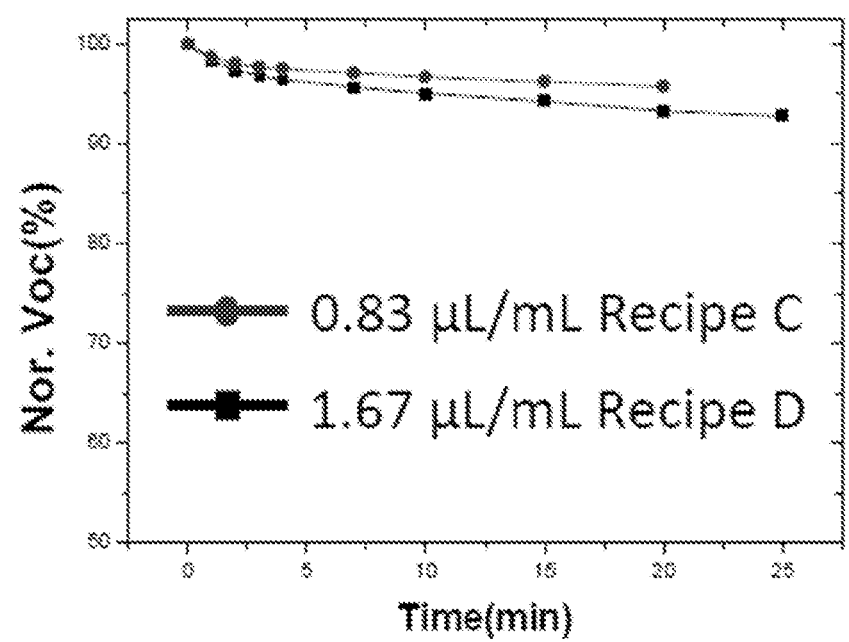
Figure 8C:
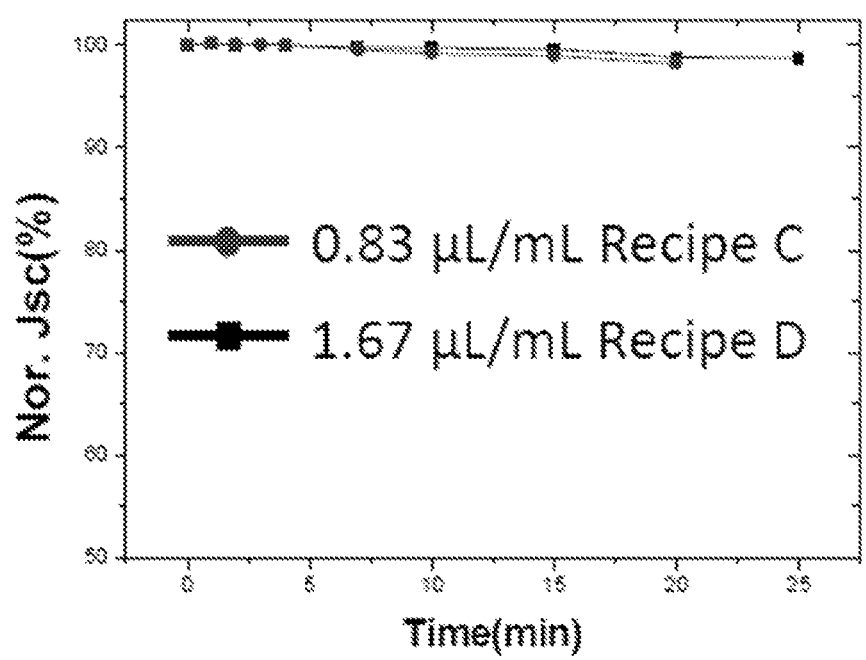
Figure 8D:
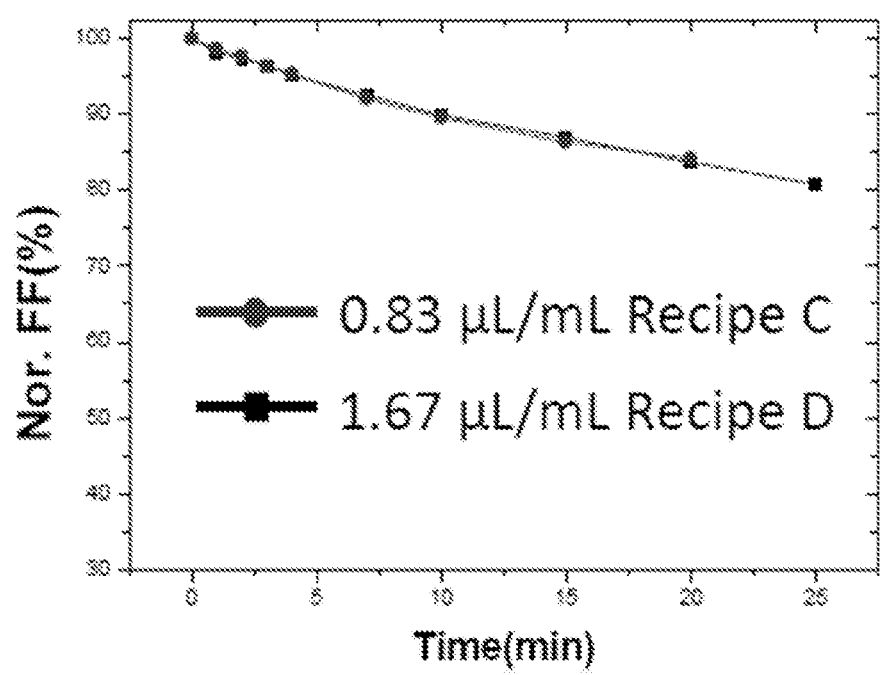
Figure 9A:
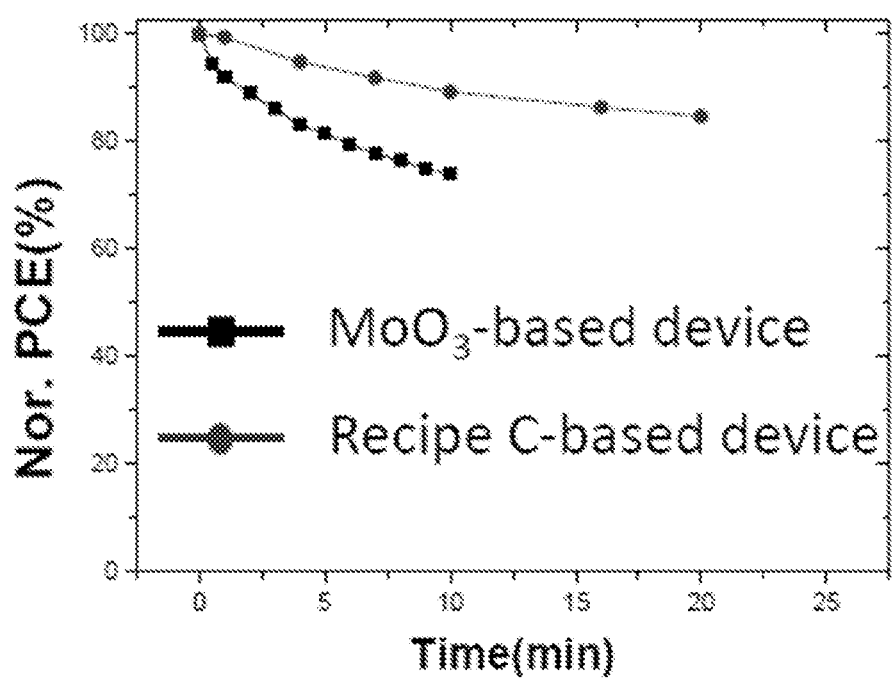
FIG. 9a to FIG. 9d are schematic diagrams of relating open-circuit voltage (FIG. 9a), short circuit current (FIG. 9b), fill factor (FIG. 9c), and power conversion efficiency (FIG. 9d) versus time of the organic photodiode with VOx:PEDOT:PSS according to an embodiment of the present invention and that of $MoO_3$.
Figure 9B:
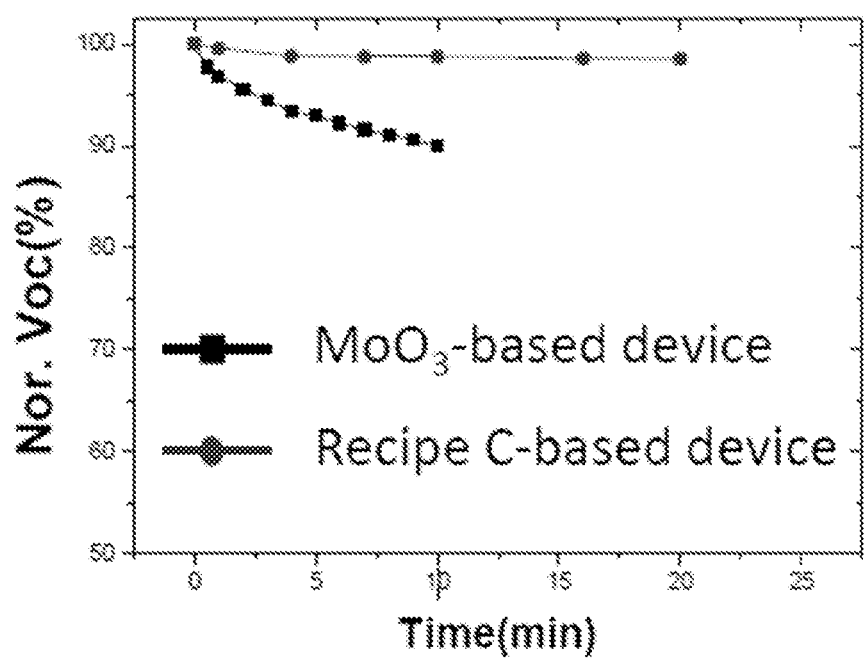
Figure 9C:
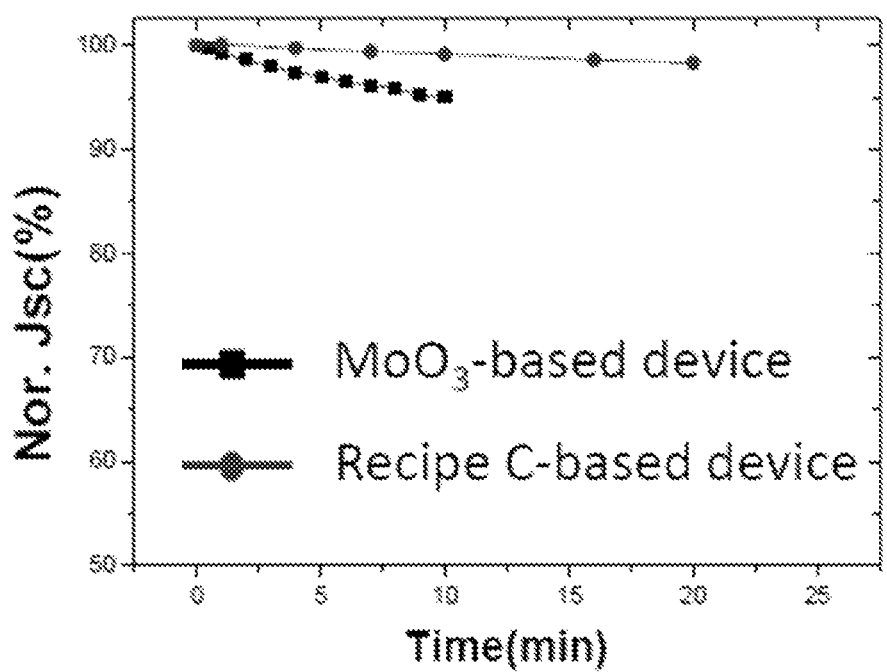
Figure 9D:
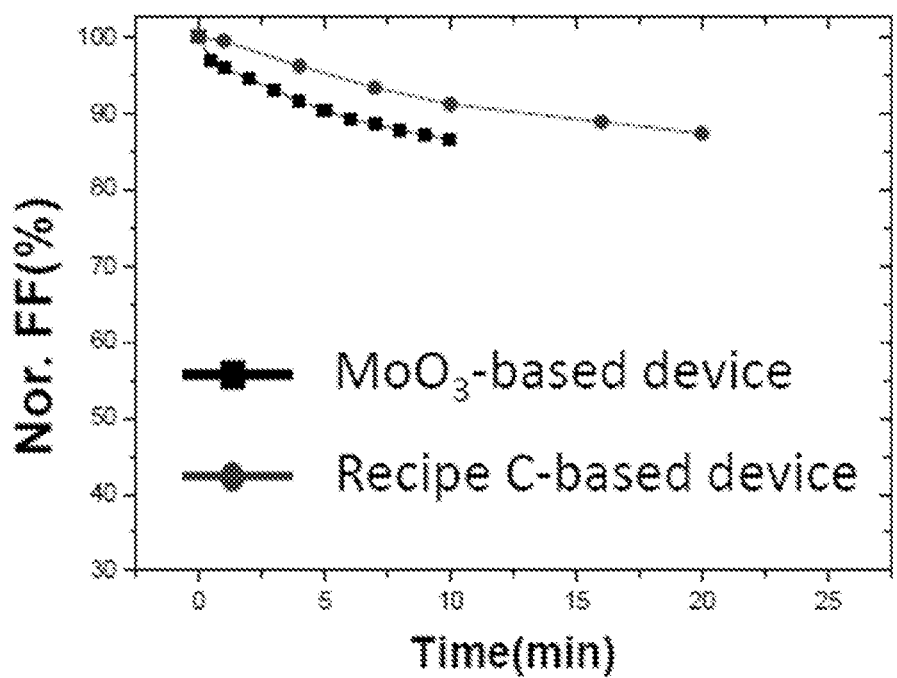
Figure 10A:
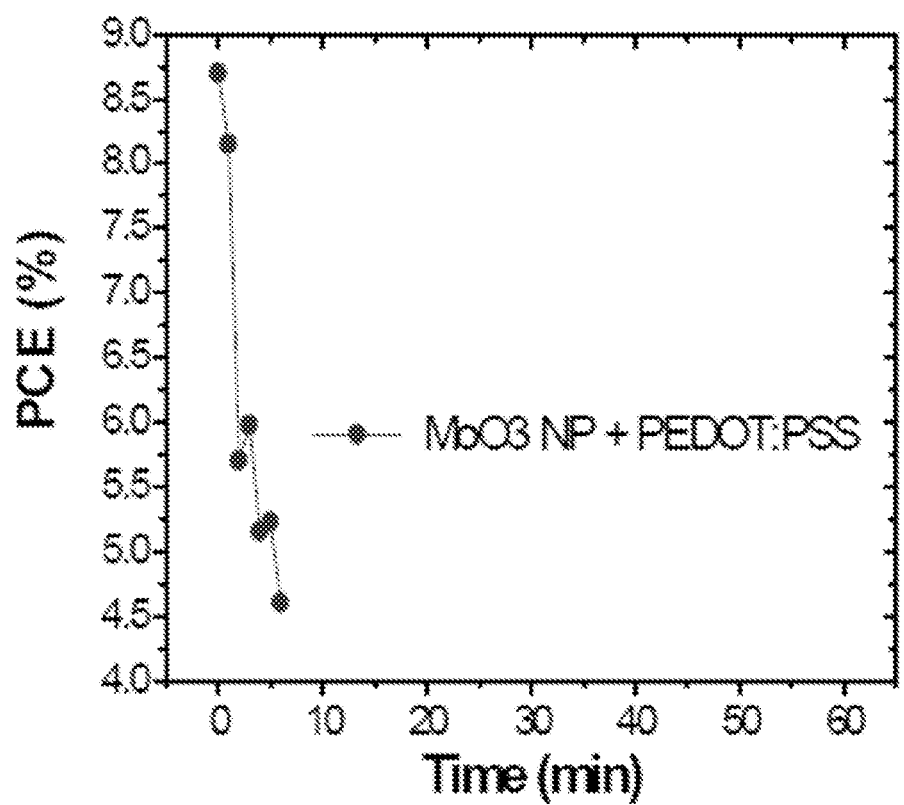
FIG. 10a to FIG. 10d are schematic diagrams of relating open-circuit voltage (FIG. 10a), short circuit current (FIG. 10b), fill factor (FIG. 10c), and power conversion efficiency (FIG. 10d) versus time of the organic photodiode with $MoO_3$(NP)+PEDOT:PSS.
Figure 10B:
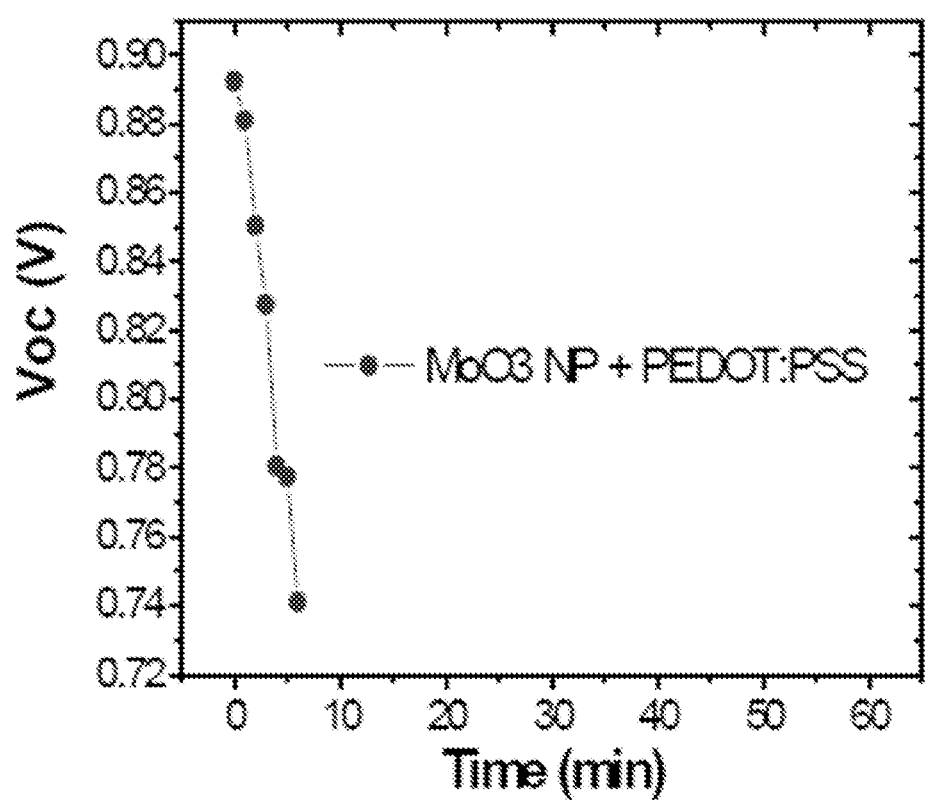
Figure 10C:
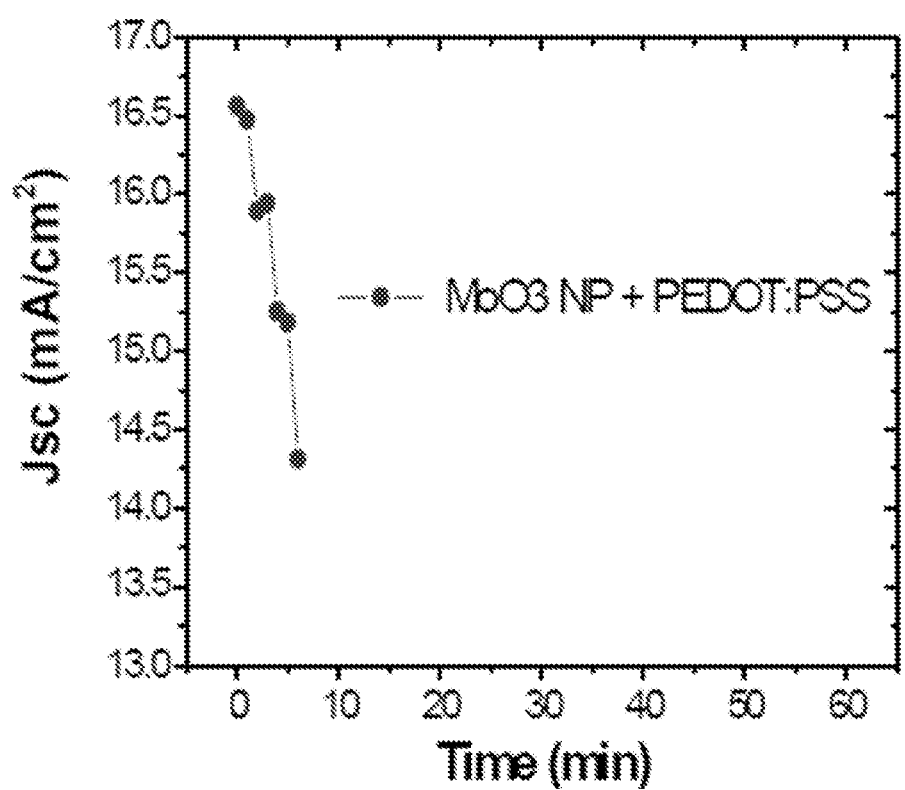
Figure 10D:
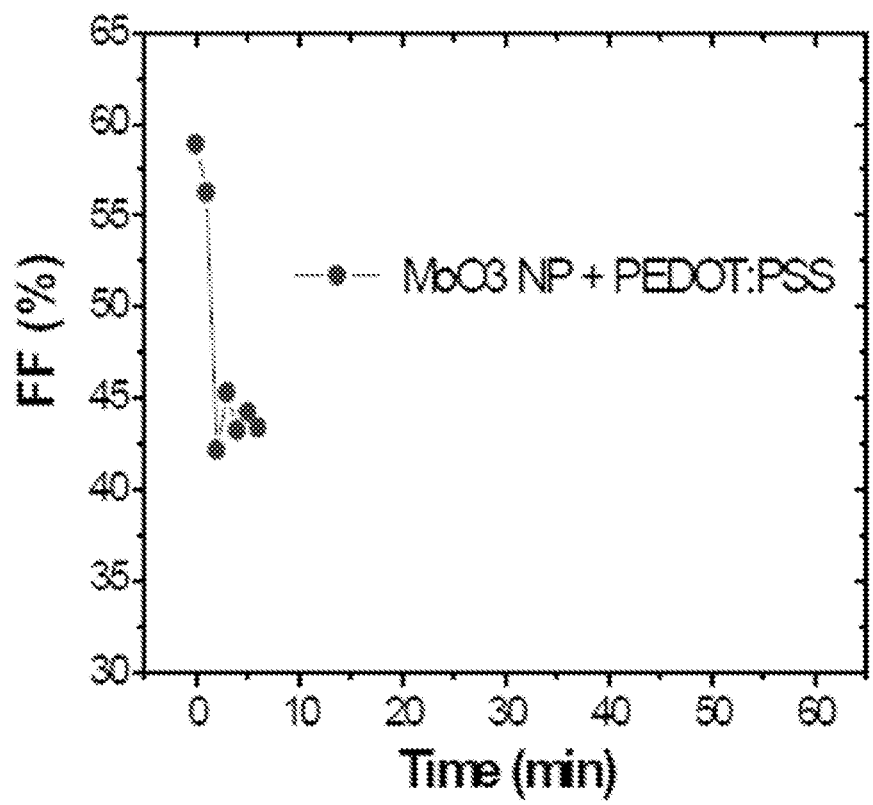

Please refer to FIG. 5 to FIG. 7. FIG. 5 is an energy level diagram of the organic photodiode with VOx:PEDOT:PSS according to an embodiment of the present invention. FIG. 6 is a schematic diagram of CR versus energy of the hole transporting material as VOx:PEDOT:PSS according to an embodiment of the present invention. FIG. 7 is a schematic diagram of current versus voltage of the organic photodiode with VOx:PEDOT:PSS according to an embodiment of the present invention. As shown in FIG. 5 and FIG. 6, the HOMO level of donor is −5.33 eV, and the work function of the organic photodiode of VOx:PEDOT:PSS is −5.2 eV which is closer to −5.33 eV than the work function −4.9 eV of the organic photodiode of PEDOT:PSS. Since the work function of VOx:PEDOT:PSS is closer to the HOMO of the donor, a larger open circuit voltage can be obtained. The data acquisition is performed by using an ambient photoelectron spectrometer (generally called AC II), and the film of the hole transporting material to be tested is prepared on a glass substrate. The surface of the film is excited by ultraviolet light in the atmosphere. The excited electronic signal is detected, and then the work function is converted. Table 1 shows a comparison for the organic photodiodes made by the hole transporting materials with VOx:PEDOT:PSS, PEDOT:PSS and MoO$_3$:

TABLE 1

| HTL | $V_{oc}$ (V) | $J_{sc}$ (mA/cm$^2$) | FF (%) | PCE (%) |
| --- | --- | --- | --- | --- |
| MoO$_3$ | 0.92 | 19.3 | 75.3 | 13.4 |
| PEDOT:PSS | 0.63 | 17.1 | 58.5 | 6.30 |
| VOx:PEDOT:PSS | 0.87 | 16.8 | 70.3 | 10.3 |

As shown in table 1 and FIG. 7, the power conversion efficiency of VOx:PEDOT:PSS is better than that of PEDOT:PSS, and approaches that of MoO$_3$.

Please refer to FIGS. 8a to 8d and FIGS. 9a to 9d. FIGS. 8a to 8d are schematic diagrams of relating open-circuit voltage (FIG. 8a), short circuit current (FIG. 8b), fill factor (FIG. 8c), and power conversion efficiency (FIG. 8d) versus time of the organic photodiode with VOx:PEDOT:PSS for different recipe according to an embodiment of the present invention. FIGS. 9a to 9d are schematic diagrams of relating open-circuit voltage (FIG. 9a), short circuit current (FIG. 9b), fill factor (FIG. 9c), and power conversion efficiency (FIG. 9d) versus time of the organic photodiode with VOx:PEDOT:PSS according to an embodiment of the present invention and that of MoO$_3$. In order to understand the relationship between the concentration of the precursor solution of the transition metal oxide in PEDOT:PSS and efficacy, do the following concentration experiments as shown in table 2, FIG. 8a to FIG. 8d and FIG. 9a to FIG. 9d.

TABLE 2

| Recipe | Precursor in alcohol (μL/mL) | (precursor:alcohol): PEDOT:PSS ratio in v.v | Conc. of precursor in PEDOT:PSS (μL/mL) | $V_{oc}$ (V) | $J_{sc}$ (mA/cm$^2$) | FF (%) | PCE (%) |
| --- | --- | --- | --- | --- | --- | --- | --- |
| MoO$_3$ | — | — | — | 0.90 | 18.0 | 73.2 | 11.9 |
| A | 0 | — | 0 | 0.70 | 14.5 | 44.6 | 4.6 |
| B | 2.78 | 2:8 | 0.56 | 0.77 | 16.3 | 62.0 | 7.8 |
| C | 4.17 | 2:8 | 0.83 | 0.86 | 16.8 | 65.6 | 9.4 |
| D | 8.33 | 2:8 | 1.67 | 0.87 | 16.8 | 70.3 | 10.3 |
| E | 16.7 | 2:8 | 3.34 | 0.88 | 16.7 | 70.1 | 10.2 |

As shown in table 2, FIG. 8a to FIG. 8d and FIG. 9a to FIG. 9d. In a better range of the concentration of the plurality of transition metal oxide particles in the conductive polymer coil is in the range of 0.1 μL/mL~10 μL/mL. In a more better range of the concentration of the plurality of transition metal oxide particles in the conductive polymer coil is in the range of 0.5 μL/mL~5 μL/mL. As shown in FIG. 8a to FIG. 8d, the condition of the experiment is that all of the organic photodiodes are un-encapsulated, 100 mW/cm$^2$, continuous light soaking under Xenon lamp for 30 min, and at a temperature of 25° C. The light stability of Recipe C and Recipe D are similar. As shown in FIG. 9a to FIG. 9d, the condition of the experiment is that all of the organic photodiodes are un-encapsulated, 100 mW/cm$^2$, continuous light soaking under Xenon lamp for 10 to 30 min, and at a temperature of 25° C. The light stability of Recipe C is better than that of MoO$_3$. As said above, the power conversion efficiency of the organic photodiode with VOx:PEDOT:PSS is better than that of the organic photodiode with PEDOT:PSS, and light stability of the organic photodiode of the present invention is better than that of the organic photodiode of MoO$_3$.

Table 2 shows a comparison for the organic photodiodes made by the hole transporting material with VOx:PEDOT:PSS and with using sol-gel derived VO$_x$. The power conversion efficiency of the organic photodiode with VOx:PEDOT:PSS is not only better than that of the organic photodiode with PEDOT:PSS, but also better than that of the organic photodiode with sol-gel VO$_x$ (as shown in table 3). Wherein, the Active layer system comprises at least one of the following compounds:

Donors

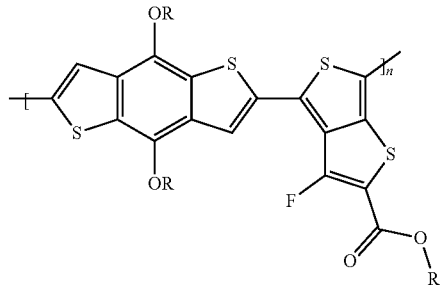

R = 2-ethylhexyl

PTB7

-continued

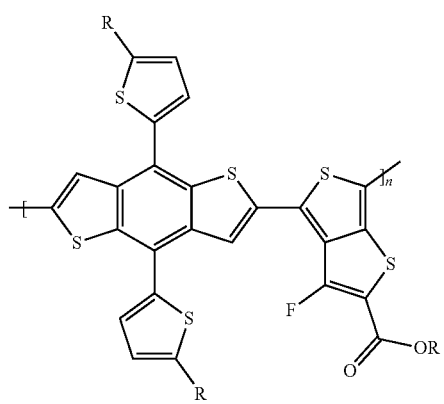

R = 2-ethylhexyl

PTB7-Th

9
-continued
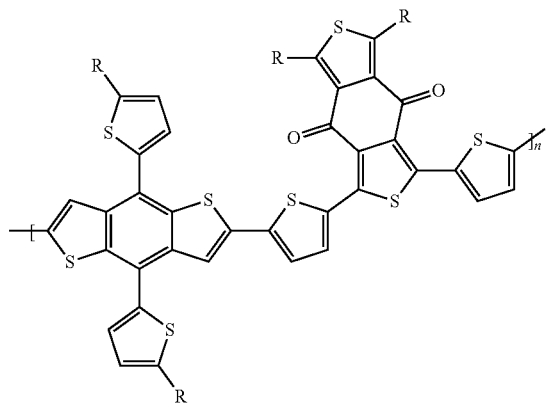
R = 2-ethylhexyl
PBDB-T
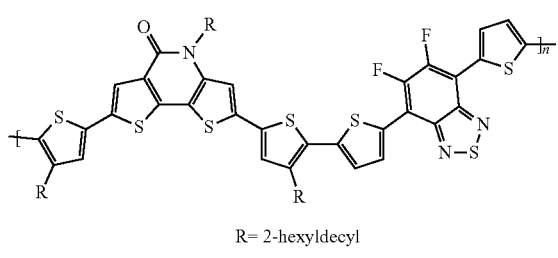
R= 2-hexyldecyl
PDTP4TFBT
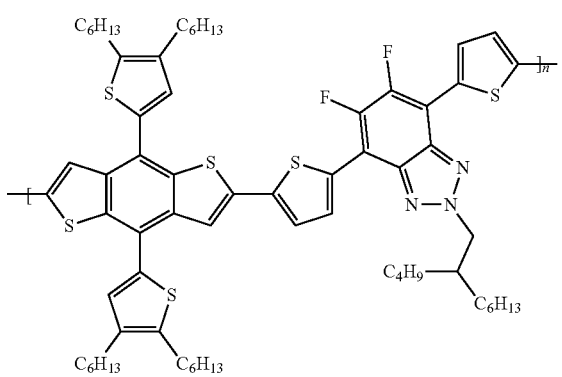
PBTA-BO
10
-continued
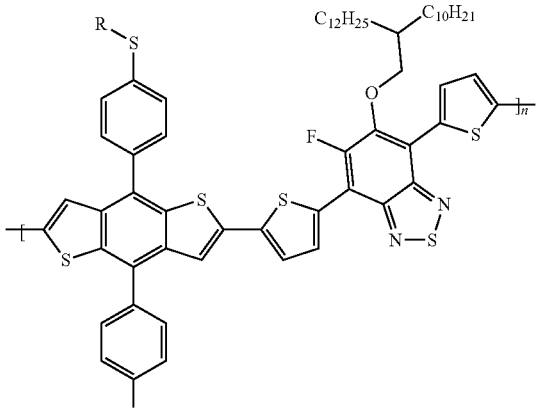
R = 2-ethylhexyl
PPBDTBT
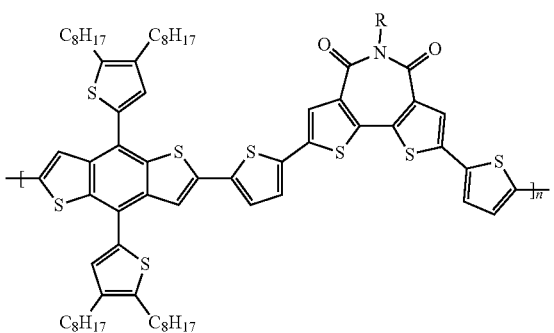
R= 2-hexyldecyl
PDOT
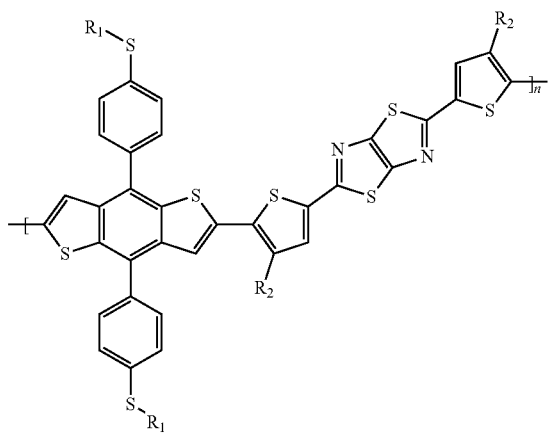
R1 = 2-butyloctyl
R2= 2-ethylhexyl
PSTZ 11
-continued
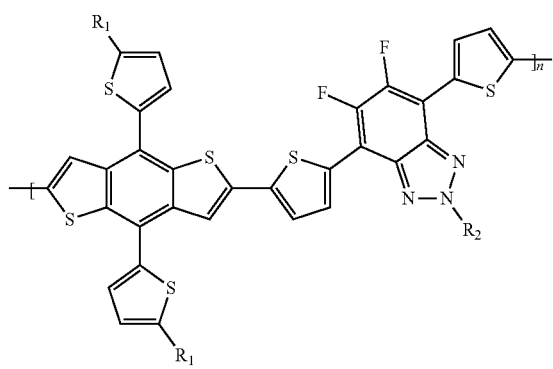
R₁ = 2-ethylhexyl
R₂ = 2-hexyldecyl
J52
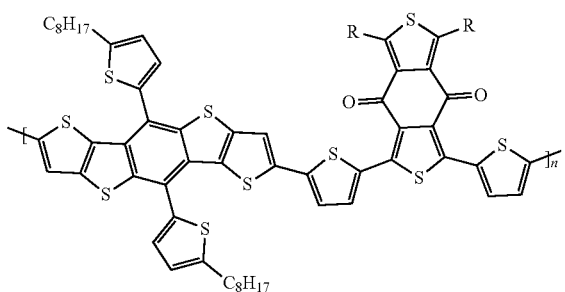
R = 2-ethylhexyl
PDBT-T1
12
-continued
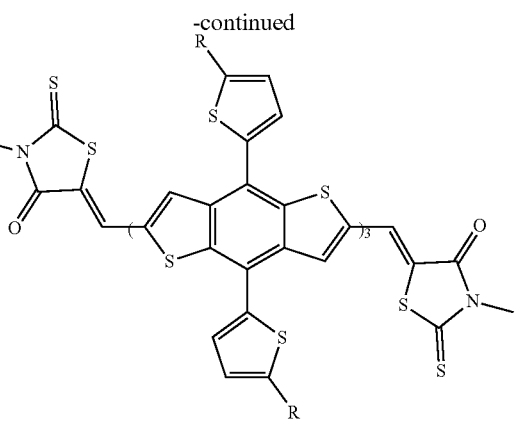
R = 2-ethylhexyl
DRTB-T
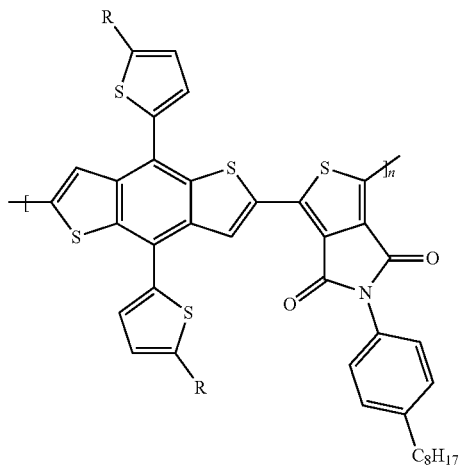
R = 2-ethylhexyl
PTP8
Acceptors
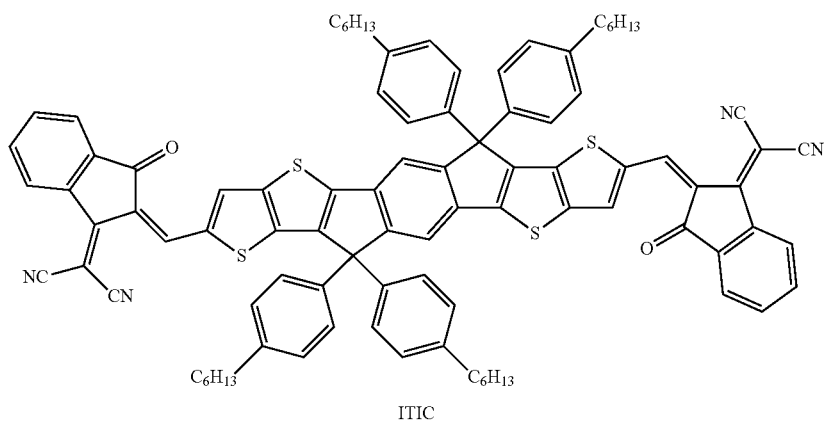
ITIC -continued
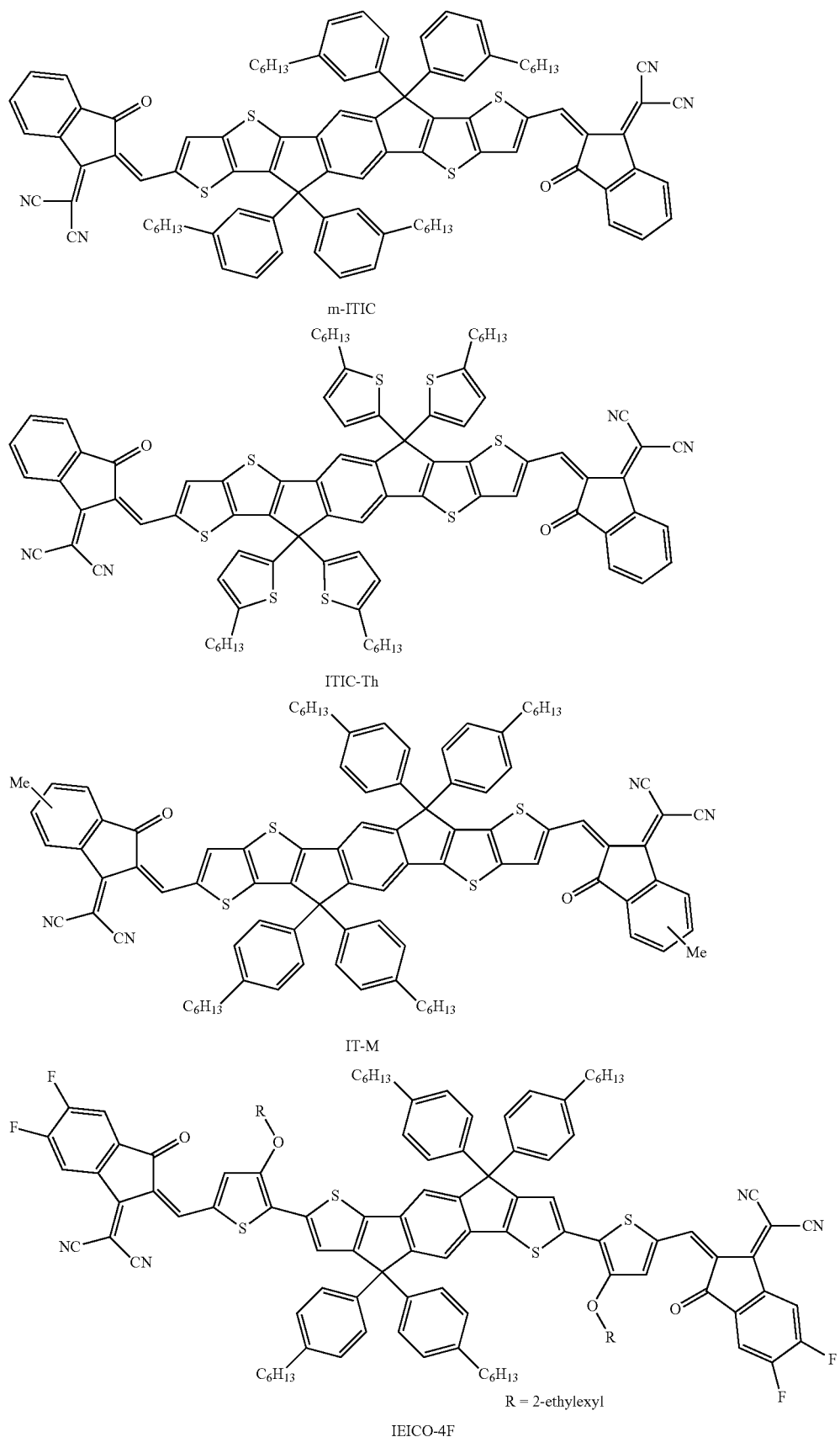
m-ITIC
ITIC-Th
IT-M
IEICO-4F -continued
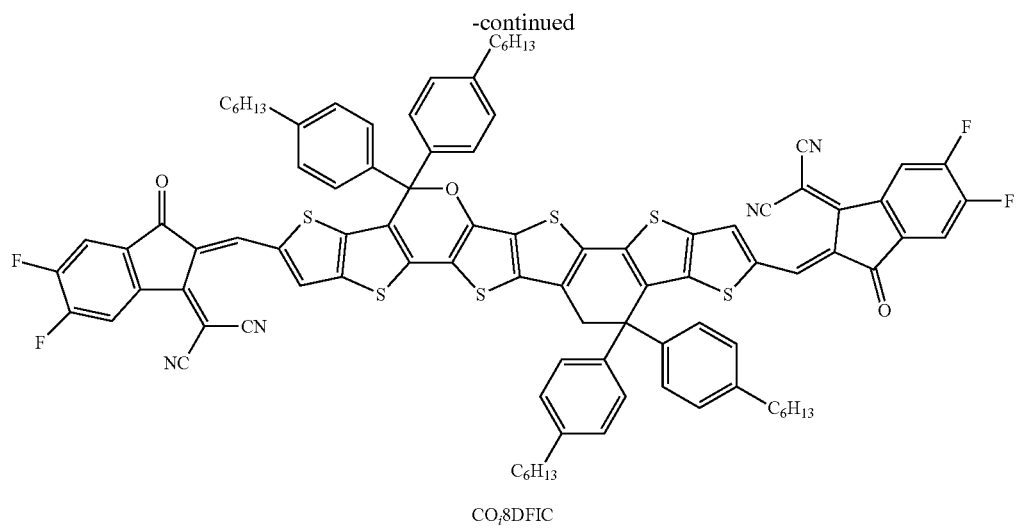
CO<sub>i</sub>8DFIC
IDIC
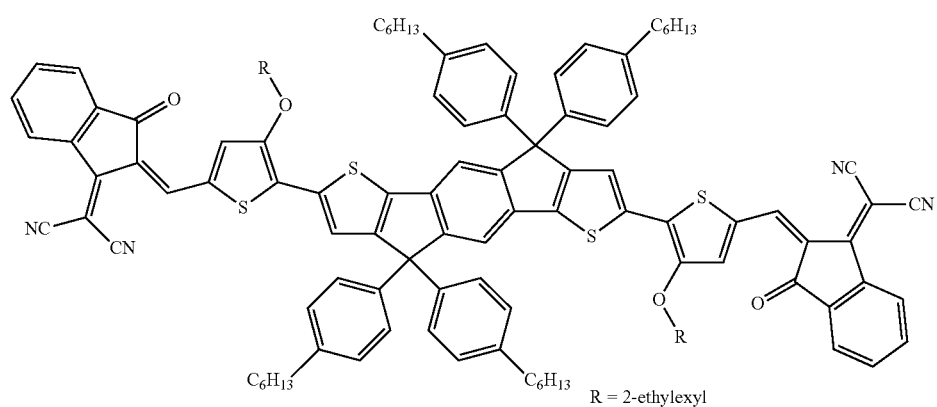
R = 2-ethylexyl
IEICO
TABLE 3
|  | Active layer system 1 | | | | Active layer system 2 | | | | Active layer system 3 | | | |
| --- | --- | --- | --- | --- | --- | --- | --- | --- | --- | --- | --- | --- |
|  | $V_{oc}$ (V) | $J_{sc}$ (mA/cm$^2$) | FF (%) | PCE (%) | $V_{oc}$ (V) | $J_{sc}$ (mA/cm$^2$) | FF (%) | PCE (%) | $V_{oc}$ (V) | $J_{sc}$ (mA/cm$^2$) | FF (%) | PCE (%) |
| MoO$_3$ | 0.80 | 20.09 | 72.26 | 11.63 | 0.90 | 18.26 | 74.11 | 12.15 | 0.81 | 19.69 | 75.10 | 11.93 |
| PEDOT:PSS | 0.51 | 17.88 | 58.82 | 5.35 | 0.73 | 16.59 | 60.81 | 7.38 | 0.62 | 17.96 | 63.12 | 6.98 |
| Sol-gel VO$_x$ | 0.79 | 11.97 | 64.83 | 6.10 | 0.87 | 10.76 | 57.98 | 5.40 | 0.80 | 10.34 | 59.62 | 4.95 |
| VO$_x$:PEDOT: PSS | 0.76 | 18.42 | 66.23 | 9.23 | 0.86 | 16.78 | 65.58 | 9.43 | 0.76 | 18.42 | 68.02 | 9.50 |

As shown in table 3, the values of the power conversion efficiency of the present invention in different active layers are similar. It means that the hole transport layer of the hole transporting material of the present invention can exhibit the best characteristics in different active layers, and does not affected by the selectivity of the active layer.

In addition, the organic photodiode includes one of the photovoltaic, photodetector, light-emitting diode, and transistor.

Table 4 shows a comparison for the organic photodiodes made by the hole transporting material with $VO_x$:PEDOT:PSS, PEDOT:PSS and $MoO_3$(NP)+PEDOT:PSS. $MoO_3$(NP)+PEDOT:PSS is made by directly mixing the nanoparticle of $MoO_3$ into PEDOT:PSS. Please refer to FIG. 10a to 10d. FIG. 10a to 10d are schematic diagrams of relating open-circuit voltage, short circuit current, fill factor, and power conversion efficiency versus time of the organic photodiode with $MoO_3$(NP)+PEDOT:PSS. As shown in FIG. 10a to FIG. 10d, the light stability of the organic photodiode of $MoO_3$(NP)+PEDOT:PSS is poor. As shown in table 4, the power conversion efficiency of the present invention is better than that of $MoO_3$(NP)+PEDOT:PSS. As said above, the power conversion efficiency of the organic photodiode made by the method of manufacturing the hole transporting material of $VO_x$:PEDOT:PSS is better than that of directly mixing the nanoparticle of $MoO_3$ into PEDOT:PSS.

TABLE 4

|  | $V_{oc}$ (V) | $J_{sc}$ (mA/cm$^2$) | FF (%) | PCE (%) |
|---|---|---|---|---|
| $MoO_3$ | 0.91 | 18.0 | 75.1 | 12.3 |
| PEDOT:PSS | 0.73 | 16.6 | 60.8 | 7.37 |
| $VO_x$:PEDOT:PSS | 0.87 | 16.8 | 70.3 | 10.3 |
| $MoO_3$(NP) + PEDOT:PSS | 0.89 | 16.6 | 58.9 | 8.70 |

Compared with the prior art, the hole transporting material of the present invention can have a good match with the electron donor material of the active layer, so that the organic photodiode including the hole transporting material can be provided a better power conversion efficiency than using PEDOT:PSS for a hole transporting material. In addition, the organic photodiode made by the method of manufacturing the hole transporting material of the present invention also has a better power conversion efficiency.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of manufacturing a hole transporting material, comprising the steps as following:
   providing a precursor solution of a transition metal oxide;
   providing a conductive polymer solution;
   adding the precursor solution of the transition metal oxide into the conductive polymer; and
   stirring the mixture of the precursor solution of the transition metal oxide and the conductive polymer solution to cause a sol-gel reaction, and form a hole transporting material which comprises a conductive polymer coil and a plurality of transition metal oxide particles.

2. The method of manufacturing the hole transporting material of the claim 1, wherein work function of the hole transporting material is larger than the work function of poly(3,4-ethylenedioxythiophene)polystyrene sulfonate (PEDOT:PSS).

3. The method of manufacturing the hole transporting material of the claim 1, wherein the concentration of the plurality of transition metal oxide particles in the conductive polymer coil is in the range of 0.1 µL/mL~10 µL/mL.

4. The method of manufacturing the hole transporting material of the claim 1, wherein the concentration of the plurality of transition metal oxide particles in the conductive polymer coil is in the range of 0.5 µL/mL~5 µL/mL.

5. The method of manufacturing the hole transporting material of the claim 1, wherein the precursor solution of the transition metal oxide comprising:
   a precursor of the transition metal oxide; and
   an alcohol solvent;
   wherein the precursor of the transition metal oxide dispersed evenly in the alcohol solvent.

6. The method of manufacturing the hole transporting material of the claim 1, wherein the precursor of the transition metal oxide includes at least one of vanadium (V) oxytriisopropoxide, vanadium(V) oxytriethoxide, tris(triphenylsiloxy)vanadium oxide, vanadium(V) oxychloride, ammonium molybdate, molybdenum(III) chloride, molybdenum(V) chloride, molybdenum(V) chloride, molybdenum (VI) tetrachloride oxide, tungsten oxychloride, and tungsten (VI) chloride.

7. The method of manufacturing the hole transporting material of the claim 1, wherein the conductive polymer solution and the conductive polymer coil comprise at least one of polyacetylene, polyphenylene vinylene, polypyrrole, polythiophene, polyphenylene sulfide and their derivative.

8. The method of manufacturing the hole transporting material of the claim 1, wherein the conductive polymer solution and the conductive polymer coil comprise poly(3,4-ethylenedioxythiophene)polystyrene sulfonate (PEDOT:PSS).

9. The method of manufacturing the hole transporting material of the claim 1, wherein the plurality of transition metal oxide particles comprise at least one of $MoO_3$, $V_2O_5$, NiO, and $WO_3$.

* * * * *